(12) United States Patent
Kimura et al.

(10) Patent No.: US 9,111,976 B2
(45) Date of Patent: Aug. 18, 2015

(54) TRANSFER SYSTEM

(71) Applicant: KABUSHIKI KAISHA YASKAWA DENKI, Kitakyushu-shi (JP)

(72) Inventors: Yoshiki Kimura, Kitakyushu (JP); Takashi Minami, Kitakyushu (JP)

(73) Assignee: KABUSHIKI KAISHA YASKAWA DENKI, Kitakyushu-Shi (JP)

( * ) Notice: Subject to any disclaimer, the term of this patent is extended or adjusted under 35 U.S.C. 154(b) by 380 days.

(21) Appl. No.: 13/661,039

(22) Filed: Oct. 26, 2012

(65) Prior Publication Data

US 2013/0178979 A1 Jul. 11, 2013

(30) Foreign Application Priority Data

Jan. 5, 2012 (JP) ................. 2012-000828

(51) Int. Cl.
*H01L 21/67* (2006.01)
*H01L 21/677* (2006.01)
*H01L 21/687* (2006.01)

(52) U.S. Cl.
CPC .... *H01L 21/67742* (2013.01); *H01L 21/67766* (2013.01); *H01L 21/68707* (2013.01)

(58) Field of Classification Search
CPC ................. H01L 21/67766; H01L 21/67742; H01L 21/67707
See application file for complete search history.

(56) References Cited

U.S. PATENT DOCUMENTS

| 2002/0020355 | A1* | 2/2002 | Saeki et al. | 118/719 |
| 2004/0179930 | A1* | 9/2004 | Kondoh | 414/744.2 |
| 2005/0072716 | A1* | 4/2005 | Quiles et al. | 206/710 |
| 2006/0222477 | A1* | 10/2006 | Moura et al. | 414/217 |
| 2006/0222480 | A1* | 10/2006 | Duhamel et al. | 414/744.8 |
| 2007/0116549 | A1* | 5/2007 | Rice et al. | 414/744.5 |

FOREIGN PATENT DOCUMENTS

| JP | 04-262555 | 9/1992 |
| JP | 11-340297 | 12/1999 |
| JP | 2001-219390 | 8/2001 |
| JP | 2004-535681 | 11/2004 |
| JP | 2008-028134 | 2/2008 |
| JP | 2011-159738 | 8/2011 |
| JP | 2011-205044 | 10/2011 |

(Continued)

OTHER PUBLICATIONS

Korean Office Action fo corresponding KR Application No. 10-2012-0116782, Jul. 3, 2014.
Japanese Office Action for corresponding JP Application No. 2012-000828, Dec. 3, 2013.
Chinese Office Action for corresponding CN Application No. 201210399211.8, Sep. 28, 2014.

(Continued)

*Primary Examiner* — Khoi Tran
*Assistant Examiner* — Ryan Rink
(74) *Attorney, Agent, or Firm* — Mori & Ward, LLP

(57) ABSTRACT

A transfer system according to an embodiment includes a plurality of robot hands, a storage unit, and an instructing part. The robot hands are operable to hold a thin sheet-like workpiece. The storage unit stores therein speed information that represents a temperature of the workpiece associated with a specified speed of a robot hand that holds the workpiece. The instructing part extracts the specified speed for each robot hand from the speed information and instructs to move all of the robot hands at or lower than a representative speed determined based on a set of extracted specified speed data.

15 Claims, 11 Drawing Sheets

(56) References Cited

FOREIGN PATENT DOCUMENTS

| | | | |
|---|---|---|---|
| JP | 2011205044 A | * | 10/2011 |
| JP | 2011-228627 | | 11/2011 |

OTHER PUBLICATIONS

Taiwanese Office Action for corresponding TW Application No. 101138917, Apr. 10, 2015.

* cited by examiner

FIG.5A

| HAND TYPE | TEMPERATURE TYPE | PRESENCE OF WAFER | SPECIFIED SPEED | ... |
|---|---|---|---|---|
| FIRST HAND | NORMAL TEMPERATURE | ABSENT | HIGH SPEED | ... |
| | | PRESENT | MEDIUM SPEED | ... |
| SECOND HAND | ABNORMAL TEMPERATURE | ABSENT | HIGH SPEED | ... |
| | | PRESENT | LOW SPEED | ... |
| ⋮ | ⋮ | ⋮ | ⋮ | ⋮ |

FIG.5B

| PATTERN TYPES | PRESENCE OF WAFER | | EXTRACTED SPECIFIED SPEED | | REPRESENTATIVE SPEED |
|---|---|---|---|---|---|
| | FIRST HAND | SECOND HAND | FIRST HAND | SECOND HAND | |
| PATTERN #1 | – | – | HIGH SPEED | HIGH SPEED | HIGH SPEED |
| PATTERN #2 | O | – | MEDIUM SPEED | HIGH SPEED | MEDIUM SPEED |
| PATTERN #3 | – | O | HIGH SPEED | LOW SPEED | LOW SPEED |
| PATTERN #4 | O | O | MEDIUM SPEED | LOW SPEED | LOW SPEED |

(O : WAFER PRESENT  – : WAFER ABSENT)

FIG.9

| HAND TYPE | TEMPERATURE TYPE | PRESENCE OF WAFER | SPECIFIED SPEED | ... |
|---|---|---|---|---|
| FIRST HAND | NORMAL TEMPERATURE | ABSENT | HIGH SPEED | ... |
| | | PRESENT | MEDIUM SPEED | ... |
| | ABNORMAL TEMPERATURE | ABSENT | HIGH SPEED | ... |
| | | PRESENT | LOW SPEED | ... |
| SECOND HAND | NORMAL TEMPERATURE | ABSENT | HIGH SPEED | ... |
| | | PRESENT | MEDIUM SPEED | ... |
| | ABNORMAL TEMPERATURE | ABSENT | HIGH SPEED | ... |
| | | PRESENT | LOW SPEED | ... |
| ⋮ | ⋮ | ⋮ | ⋮ | ⋮ |

TRANSFER SYSTEM

CROSS-REFERENCE TO RELATED APPLICATION

This application is based upon and claims the benefit of priority of the prior Japanese Patent Application No. 2012-000828, filed on Jan. 5, 2012, the entire contents of which are incorporated herein by reference.

FIELD

The embodiments discussed herein are directed to a transfer system.

BACKGROUND

A known transfer system transfers substrates, such as semiconductor wafers, using a robot hand (hereinafter referred to as a "hand") disposed at a distal end portion of an arm of a multi-axis robot to hold the substrates.

Such a transfer system is used in, for example, semiconductor fabricating processes for transferring substrates to and from various types of process equipment applied, for example, to cleaning, deposition, and photolithography processes (see, for example, Japanese Patent Application Laid-open No. 2008-28134).

It is noted that the substrates are exposed to, for example, a high temperature heating or excessive cooling environment and are very often placed under abnormal temperature as well as normal temperature conditions. In consideration of an adverse effect from the abnormal temperature, the method of holding the substrate may be changed over: specifically, a type of hand that holds or grips the substrate is used for substrates under normal temperature and another type of hand on which the substrate is placed is used for substrates under abnormal temperature.

In conventional transfer systems, however, sufficient consideration has not been given to a traveling speed of the hand to be varied according to the substrate holding method. For example, if the type of hand on which the substrate is placed is used, the substrate is held on the hand mainly through a frictional force. Positional deviation of the substrate may, however, result, if the hand is moved at inordinately high speeds in order to achieve improved throughput.

SUMMARY

A transfer system according to an embodiment includes a plurality of robot hands, a storage unit, and an instructing part. The plurality of robot hands operable to hold a thin sheet-like workpiece. The storage unit that stores therein speed information representing a temperature of the workpiece associated with a specified speed of a robot hand that holds the workpiece. The instructing part that extracts from the speed information the specified speed for each of the robot hands and instructs to move all of the robot hands at or lower than a representative speed determined based on a set of specified speed data thus extracted.

BRIEF DESCRIPTION OF DRAWINGS

A more complete appreciation of the invention and many of the attendant advantages thereof will be readily obtained as the same becomes better understood by reference to the following detailed description when considered in connection with the accompanying drawings, wherein:

FIG. 5A is an exemplary table illustrating speed information;

FIG. 5B is a table illustrating a process for determining a speed in a speed determining part;

FIG. 9 is an exemplary table illustrating speed information according to the second embodiment;

DESCRIPTION OF EMBODIMENTS

Transfer systems according to preferred embodiments disclosed in the present application will be described in detail below with reference to the accompanying drawings. It is noted that the embodiments described hereunder are not intended to limit the present invention.

The description to be given hereunder assumes that the workpiece to be transferred is a substrate and the substrate is a semiconductor wafer. The semiconductor wafer will be referred to as a "wafer".

First Embodiment

Figure 1:
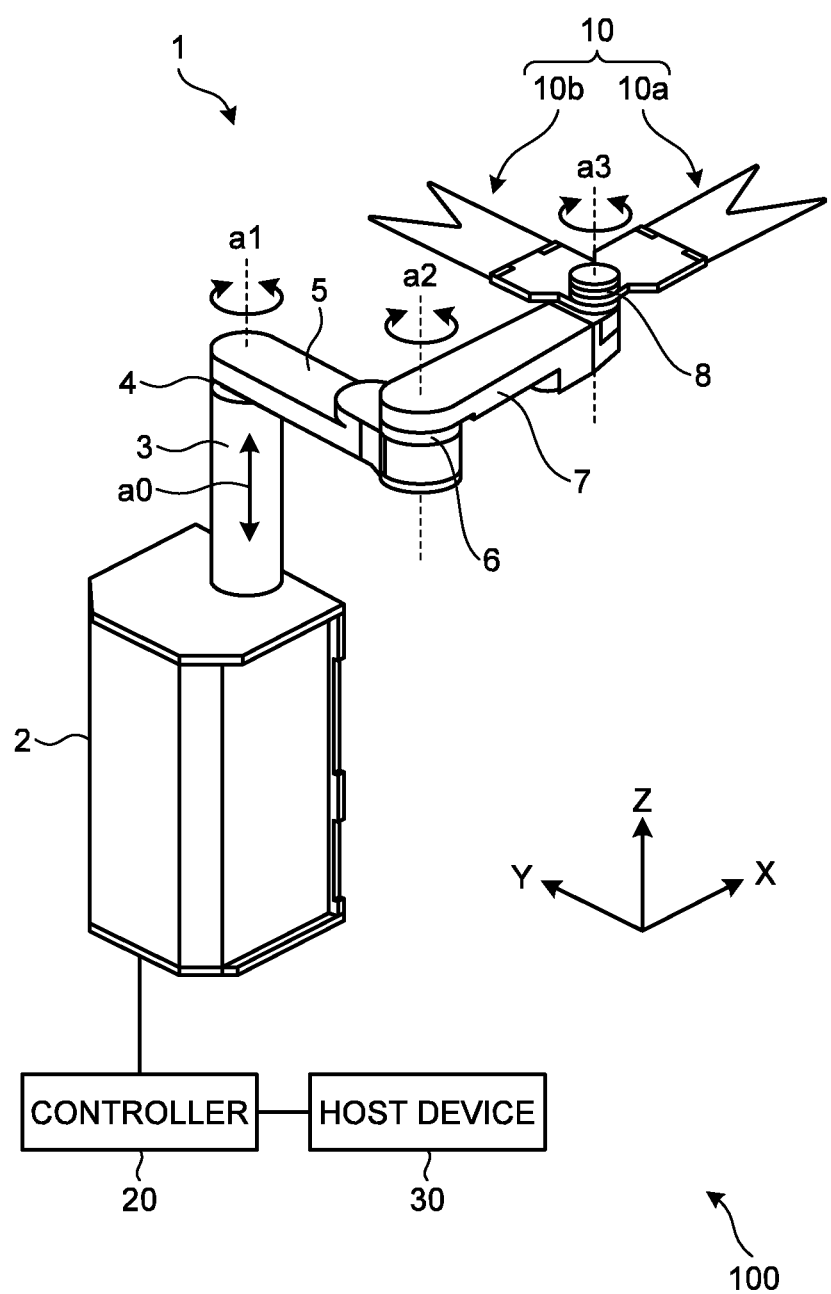
FIG. 1 is a schematic view illustrating a generation configuration of a transfer system according to a first embodiment.

A general configuration of a transfer system according to a first embodiment will be described below with reference to FIG. 1. FIG. 1 is a schematic view illustrating a generation configuration of a transfer system 100 according to the first embodiment.

For a simplified description, FIG. 1 illustrates a three-dimensional Cartesian coordinate system including a Z-axis that extends perpendicularly, its positive direction being upward and its negative direction being downward (specifically, a "perpendicular direction"). A direction extending along an XY plane thus indicates a "horizontal direction". Such a Cartesian coordinate system will also be given in other drawings to be referred to for the description given hereunder.

In the description that follows, only one of a plurality of elements, if so configured, may be denoted by a reference numeral with the rest of the elements not denoted. In such a case, the specific element denoted by a reference numeral is assumed to be configured similarly to the rest of the elements.

As illustrated in FIG. 1, the transfer system 100 according to the first embodiment includes a robot 1, a controller 20, and a host device 30. The robot 1 and the controller 20 can communicate with each other and various types of operation performed by the robot 1 are controlled by the controller 20.

The foregoing operation control is performed based on teaching data stored in advance in the controller 20. Alternatively, the teaching data may be acquired from the host device 30 that is again connected so as to permit mutual communication. Additionally, the host device 30 is capable of sequentially monitoring a status of the robot 1 (and its components).

As illustrated in FIG. 1, the robot 1 includes a base 2, a lift 3, a joint 4, a joint 6, a joint 8, a first arm 5, a second arm 7, and a hand 10.

The base 2 serves as a supporting structure for the robot 1 and is fixed on, for example, a floor surface. The lift 3 is disposed in the base 2 slidably therefrom in a perpendicular direction (the Z-axis direction) (see a double-headed arrow a0 in FIG. 1), thereby raising or lowering the entire arm of the robot 1 in the perpendicular direction.

The joint 4 is a revolute joint about an axis a1 (see the double-headed arrow about the axis a1 in FIG. 1). The first arm 5 is connected rotatably relative to the lift 3 via the joint 4.

The joint 6 is a revolute joint about an axis a2 (see the double-headed arrow about the axis a2 in FIG. 1). The second arm 7 is connected rotatably relative to the first arm 5 via the joint 6.

The joint 8 is a revolute joint about an axis a3 (see the double-headed arrow about the axis a3 in FIG. 1). The hand 10 is connected rotatably relative to the second arm 7 via the joint 8.

It is noted that the robot 1 is mounted with a drive source not illustrated, such as a motor. Each of the joint 4, the joint 6, and the joint 8 is rotated based on a drive from the drive source.

The hand 10 is an end effector that holds the wafer, including a first hand 10a (a first robot hand) and a second hand 10b (a second robot hand). The first hand 10a and the second hand 10b are disposed one on top of the other concentrically on the axis a3, each being independently rotatable about the axis a3.

The configuration of the first hand 10a and the second hand 10b will be described in detail later. It is noted that each of the first hand 10a and the second hand 10b may be arranged differently from, or similarly to, each other. The first embodiment will be described based on the first hand 10a and the second hand 10b being arranged similarly to each other.

Additionally, the first embodiment will be described for an exemplary configuration in which the hand 10 includes one first hand 10a and one second hand 10b. The description is not, however, intended to limit the quantity of the components of the hand 10.

Figure 2:
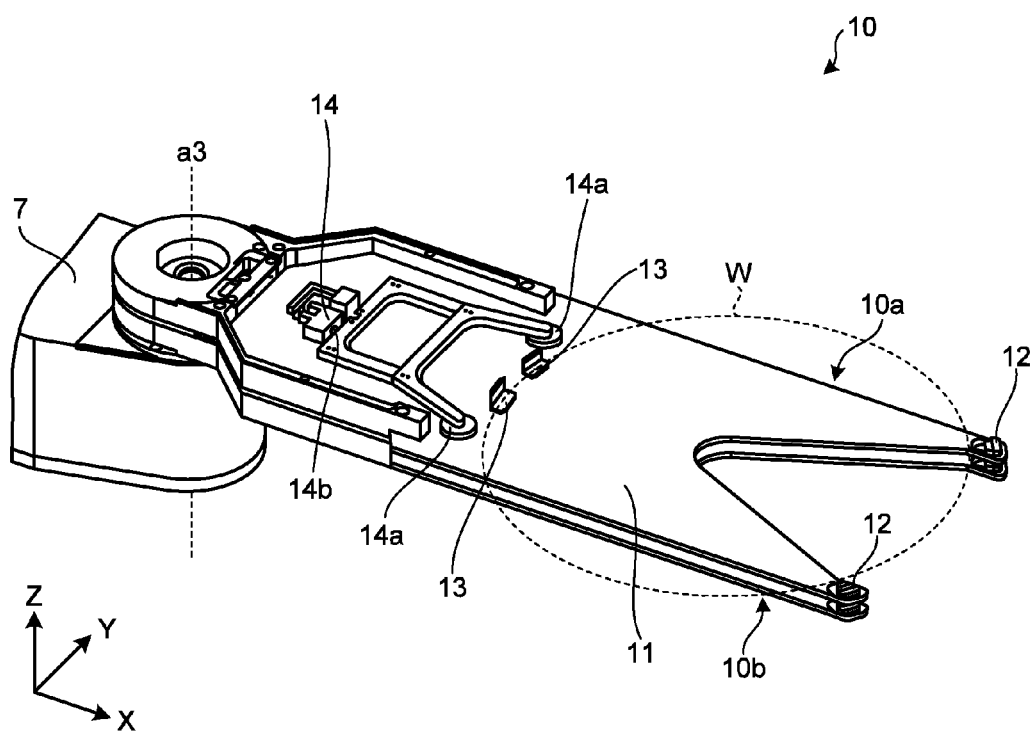
FIG. 2 is a schematic perspective view illustrating a hand according to the first embodiment.

The configuration of the hand 10 according to the first embodiment will be described below with reference to FIG. 2. FIG. 2 is a schematic perspective view illustrating the hand 10 according to the first embodiment. It is noted that FIG. 2 illustrates a condition in which the first hand 10a and the second hand 10b each have their distal end portions facing a positive direction of an X-axis.

The description to be given with reference to FIG. 2 is concerned mainly with the first hand 10a and a detailed description for the second hand 10b having the similar configuration as the first hand 10a will be omitted. In the description given hereunder, the term "hand 10" refers to both the first hand 10a and the second hand 10b.

As illustrated in FIG. 2, the hand 10 includes the first hand 10a and the second hand 10b disposed one on top of the other concentrically on the axis a3 at a distal end portion of the second arm 7. It is noted that, in FIG. 2, the upper one is the first hand 10a, while the lower one is the second hand 10b.

The first hand 10a includes a plate 11, a distal end side supporting portion 12, a proximal end side supporting portion 13, a pressure drive section 14, and a pressing portion 14a. The pressure drive section 14 includes a protruding portion 14b.

The plate 11 is a bottom or base part on which a wafer W is placed. FIG. 2 exemplifies the plate 11 having a V-shaped distal end side. The exemplification is, however, not intended to limit the shape of the plate 11.

The distal end side supporting portion 12 is disposed at the distal end portion of the plate 11. The proximal end side supporting portion 13 is disposed at the proximal end portion of the plate 11. FIG. 2 exemplifies the distal end side supporting portion 12 and the proximal end side supporting portion 13 each being disposed in pairs. Though the distal end side supporting portion 12 and the proximal end side supporting portion 13 will be described in detail later with reference to FIG. 3, suffice it to note here that the wafer W is placed between the distal end side supporting portion 12 and the proximal end side supporting portion 13 as illustrated in FIG. 2.

The pressure drive section 14 is a drive mechanism that causes the protruding portion 14b to protrude, thereby linearly moving the pressing portion 14a in the X-axis direction. The pressure drive section 14 is formed using, for example, an air cylinder. It is noted that shapes of the pressure drive section 14, the pressing portion 14a, and other members associated with the pressure drive section 14 are exemplary only and are not intended to limit their shapes.

Differences in the method of holding the wafer W commonly varied according to the temperature condition of the wafer W will be described below. When the wafer W is at normal temperature, the temperature of the wafer W is less likely to affect each of different members constituting the hand 10. The wafer W itself is also less likely to develop warp or breakage, so that the hand 10 can incorporate a holding method with which the hand 10 clamps a peripheral edge of the wafer W or picks up a main surface of the wafer W through vacuum in order to prevent the wafer W from being deviated in position.

When the wafer W is at abnormal temperature, on the other hand, the temperature of the wafer W is likely to affect each of the different members constituting the hand 10. The wafer W itself is also likely to develop warp or breakage. In such cases, preferably, the hand 10 incorporates a holding method with which the wafer W is placed on the hand 10, or dropped into a recess therein, instead of the abovementioned method of holding or vacuum pickup with which force tends to be applied to the wafer W.

Figure 3A:
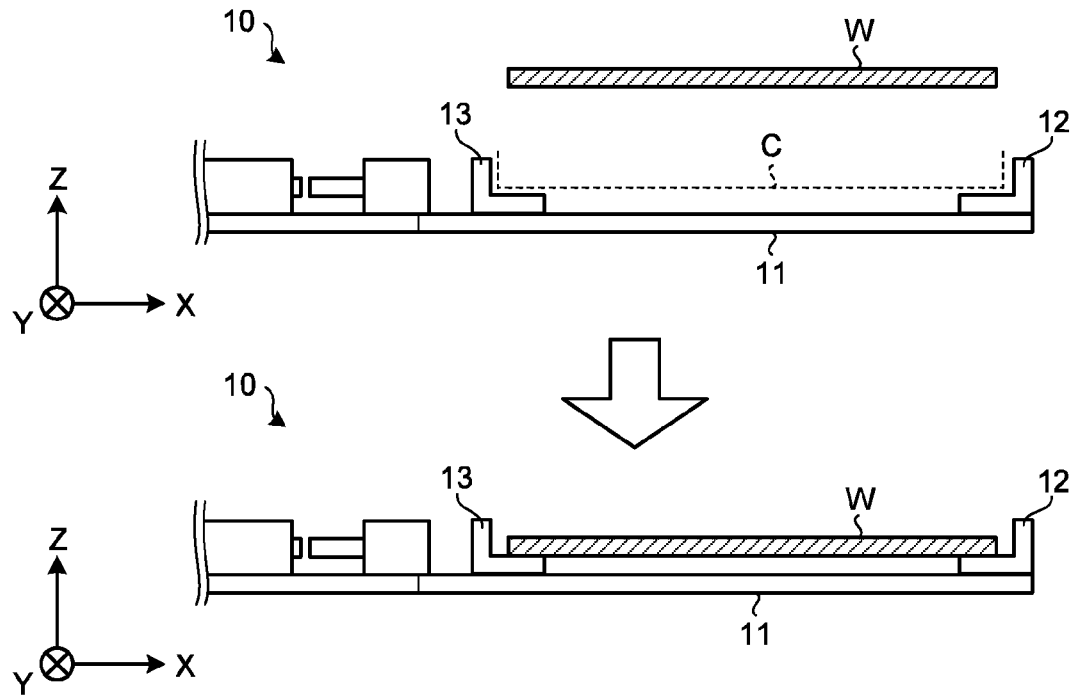
FIG. 3A is a schematic view illustrating a holding method for a wafer at abnormal temperature.
Figure 3B:
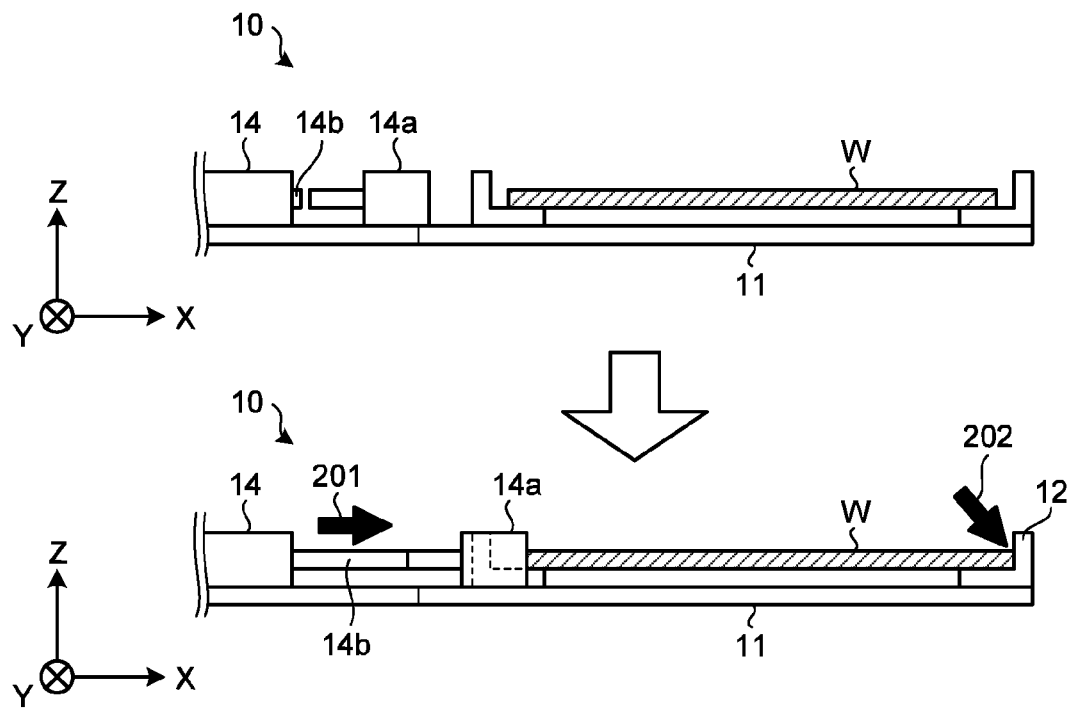
FIG. 3B is a schematic view illustrating a holding method for a wafer at normal temperature.

Given the foregoing differences in the holding method, holding methods for the wafer W in the hand 10 according to the first embodiment will be described below with reference to FIGS. 3A and 3B. FIG. 3A is a schematic view illustrating the holding method for the wafer W at abnormal temperature. FIG. 3B is a schematic view illustrating the holding method for the wafer W at normal temperature. It is noted that FIGS. 3A and 3B schematically illustrate the hand 10 as viewed from the negative direction of the Y-axis.

Additionally, FIGS. 3A and 3B illustrate the hand 10 having the L-shaped distal end side supporting portion 12 and the L-shaped proximal end side supporting portion 13. The shapes of the proximal end side supporting portion 13 and the distal end side supporting portion 12 are not, however, limited to the L-shape, as long as each has surfaces that abut on the wafer W in the horizontal direction and the perpendicular direction.

The upper illustration of FIG. 3A illustrates a condition before the wafer W is placed on the hand 10, while the lower illustration of FIG. 3A illustrates a condition after the wafer W is placed on the hand 10. As such, when the wafer W is at abnormal temperature, the hand 10 holds the wafer W in place by placing the wafer W between the distal end side supporting portion 12 and the proximal end side supporting portion 13 of the plate 11.

The foregoing holding method is concerned with the method of placing the wafer W as described earlier. As illustrated in the upper illustration of FIG. 3A, however, the method may be said to be concerned with the method of dropping the wafer W into a recess C formed by the distal end side supporting portion 12 and the proximal end side supporting portion 13.

It is noted that, as illustrated in FIG. 3A, the distal end side supporting portion 12 and the proximal end side supporting portion 13 support from a downward direction the wafer W that is, at this time, raised from the plate 11. This helps prevent the temperature of the wafer W at abnormal temperature from affecting the plate 11.

In addition, the wafer W is, at this time, held onto the hand 10 mainly by a frictional force on a contact surface with the distal end side supporting portion 12 and the proximal end side supporting portion 13. Consequently, when the wafer W at abnormal temperature illustrated in FIG. 3A is held in place, in terms of preventing the wafer W from being deviated in position, preferably the hand 10 is moved at a speed lower than at least when the wafer W is not held.

Preferably, the distal end side supporting portion 12 and the proximal end side supporting portion 13 that contact the wafer W as described above is formed from a super-heat-resistant material, such as a polyimide resin.

The upper illustration of FIG. 3B illustrates a condition after the wafer W is placed on the hand 10, while the lower illustration of FIG. 3B illustrates a condition after the wafer W is held in place in the hand 10. As such, when the wafer W is at normal temperature, the hand 10 holds the wafer W in place by clamping the wafer W between the pressing portion 14a and the distal end side supporting portion 12.

Specifically, as illustrated in FIG. 3B, the pressure drive section 14 causes the protruding portion 14b to protrude, thereby causing the pressing portion 14a to press a peripheral edge of the wafer W (see an arrow 201 in FIG. 3B), so that a peripheral edge of the wafer W on a side opposite to the side pressed by the pressing portion 14a abuts on a side wall of the distal end side supporting portion 12 (see an arrow 202 in FIG. 3B). A mechanism for holding the wafer W in place, including the pressure drive section 14, the pressing portion 14a, and the distal end side supporting portion 12 may hereinafter be referred to as a "holding mechanism".

The holding mechanism holds the wafer W in place when the wafer W is clamped between the pressing portion 14a and the distal end side supporting portion 12 with a predetermined pressure. When the wafer W at normal temperature illustrated in FIG. 3B is held in place, therefore, the hand 10 can be moved at a speed higher than at least for the wafer W at abnormal temperature held in place mainly by a frictional force.

In terms of throughput and protection of the wafer W, when the wafer W at normal temperature illustrated in FIG. 3B is held in place, preferably the hand 10 is moved at a speed lower than at least when the wafer W is not held.

Given the holding methods for the wafer W described heretofore, an exemplary specific control method in the transfer system 100 according to the first embodiment will be specifically described below. For a simplified description, in the transfer system 100 according to the first embodiment, the first hand 10a is dedicated to use for "normal temperature" and the second hand 10b is dedicated to use for "abnormal temperature".

Specifically, the first hand 10a is used by enabling an operation of the holding mechanism, while the second hand 10b is used by disabling the operation of the holding mechanism. It is noted that the first hand 10a and the second hand 10b may be regarded as having a different configuration from each other, the first hand 10a having the holding mechanism and the second hand 10b not having the holding mechanism.

In addition, the host device 30 (see FIG. 1) notifies the controller 20 (see FIG. 1) of whether the first hand 10a and the second hand 10b, each being dedicated to a specific application, actually hold the wafer W in place, specifically, the condition of the hand 10 including presence of the wafer W.

Figure 4:
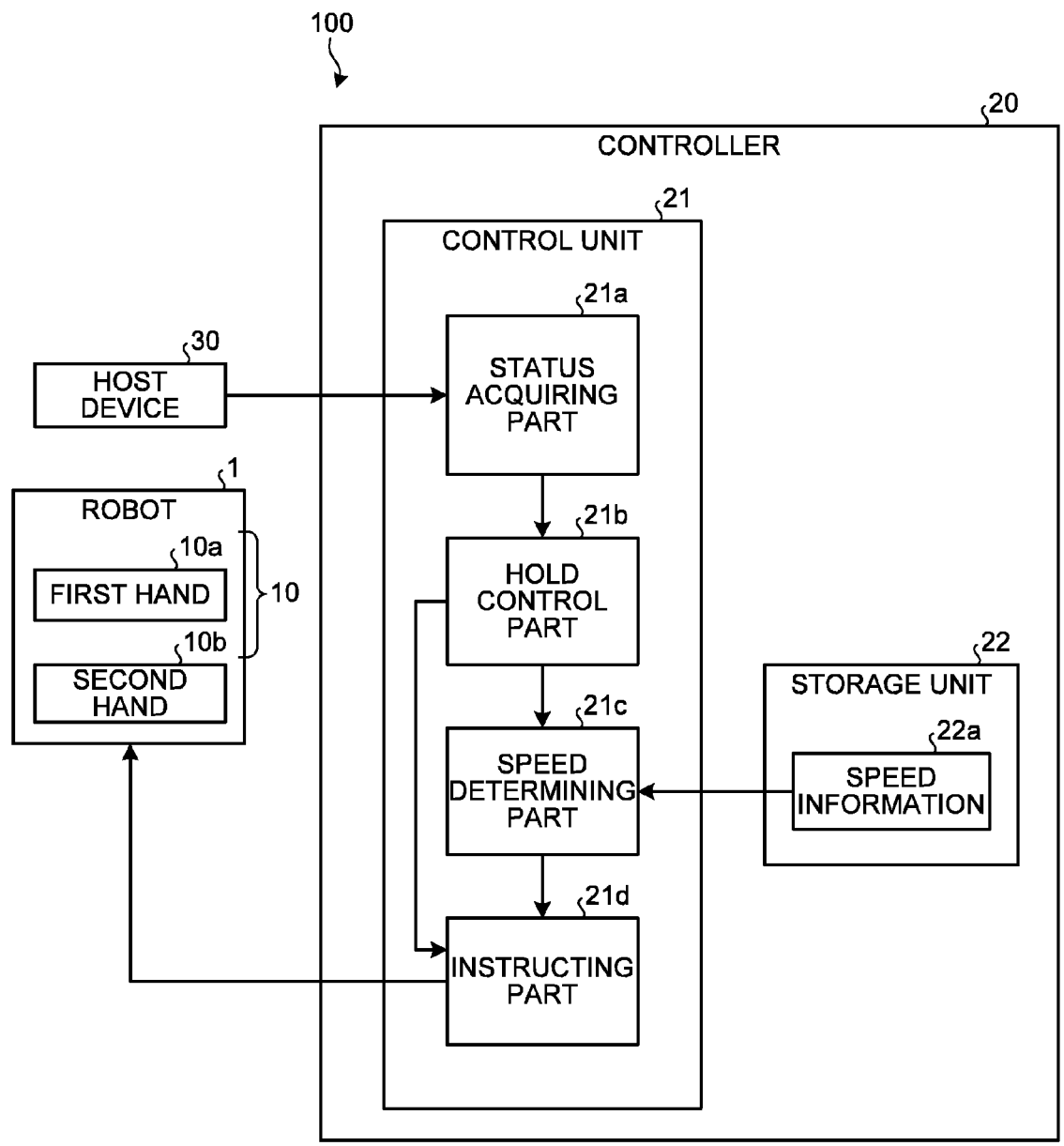
FIG. 4 is a block diagram illustrating an exemplary configuration of the transfer system according to the first embodiment.

FIG. 4 is a block diagram illustrating the transfer system 100 according to the first embodiment. FIG. 4 illustrates only those components required for describing the control method for the transfer system 100, with descriptions for general components omitted.

As illustrated in FIG. 4, though the description given with reference to FIG. 1 is here repeated, the transfer system 100 includes the robot 1, the controller 20, and the host device 30. The robot 1 further includes the hand 10 including the first hand 10a for the "normal temperature" and the second hand 10b for the "abnormal temperature". Descriptions for other components of the robot 1 illustrated in FIGS. 1 and 2 are here omitted.

The controller 20 includes a control unit 21 and a storage unit 22. The control unit 21 includes a status acquiring part 21a, a hold control part 21b, a speed determining part 21c, and an instructing part 21d. The storage unit 22 stores therein speed information 22a.

Detailed descriptions for the robot 1 and the hand 10, which have already been given, will here be omitted.

The control unit 21 generally controls the controller 20. The status acquiring part 21a acquires from the host device 30 a status of the hand 10 including whether the wafer W is present in each of the first hand 10a and the second hand 10b. The status acquiring part 21a also notifies the hold control part 21b of the status of the hand 10 thus acquired.

The hold control part 21b requests the instructing part 21d to issue a command for operating (specifically, enabling) the holding mechanism based on the information received from the status acquiring part 21a as to whether the wafer W is present in the hand 10. It is noted that, in the first embodiment, since only the first hand 10a is for the "normal temperature" with an enabled holding mechanism, the hold control part 21b performs such processing only when the wafer W is present in the first hand 10a.

The hold control part 21b also notifies the speed determining part 21c of the information received from the status acquiring part 21a as to whether the wafer W is present in the hand 10.

The speed determining part 21c determines the speed with which to move the hand 10 based on the information received from the hold control part 21b as to whether the wafer W is present in the hand 10 and the speed information 22a stored in the storage unit 22. The speed determined by the speed determining part 21c is here defined as a "representative speed".

A process for determining the speed in the speed determining part 21c will be described in detail later with reference to FIGS. 5A through 6D.

Additionally, the speed determining part 21c requests the instructing part 21d to issue a command for moving the hand 10 at a speed equal to, or less than, the representative speed thus determined. The instructing part 21d instructs the robot 1 to operate according to the command request received from the hold control part 21b or the speed determining part 21c.

The storage unit 22 includes a storage device, such as a hard disk drive or nonvolatile memory, and stores therein the speed information 22a.

The speed information 22a represents the temperature of the wafer W associated with a predetermined speed (hereinafter referred to as a "specified speed") of the hand 10 holding the wafer W.

Exemplary speed information 22a will be described below with reference to FIG. 5A. FIG. 5A illustrates the exemplary speed information 22a.

As illustrated in FIG. 5A, the speed information 22a includes, for example, such items as "hand type", "temperature type", "presence of wafer", and "specified speed".

The "hand type" item stores therein information that identifies an each individual hand constituting the hand 10. The "temperature type" item stores therein information that classifies the temperature status of the wafer W to be held in place. The "presence of wafer" item stores therein information that identifies presence or absence of the wafer W. The "specified speed" item stores therein information that identifies the specified speed.

For a simplified description, FIG. 5A gives descriptive criteria in a text format, such as "normal temperature", for a value stored in each item of the speed information 22a. This is, however, not intended to limit the data type. With the "temperature type" and "specified speed" items, in particular, the criteria assume relative expressions of "normal temperature" and "abnormal temperature", and "high speed" and "low speed". Alternatively, numerals representing specific temperatures or speeds may be used.

In the speed information 22a, the first hand 10a dedicated to use for the normal temperature, for example, is defined as follows: specifically, "normal temperature" is invariably set for the "temperature type"; and "high speed" is set for the "specified speed" when the wafer W is "absent" and "medium speed" is set for the "specified speed" when the wafer W is "present".

The second hand 10b dedicated to use for the abnormal temperature is defined as follows: specifically, "abnormal temperature" is invariably set for the "temperature type"; "high speed" is set for the "specified speed" when the wafer W is "absent" and "low speed" is set for the "specified speed" when the wafer W is "present".

The speed determining part 21c performs a speed determining process for determining the representative speed of the hand 10 based on the speed information 22a and the information received from the hold control part 21b as to whether the wafer W is present in the hand 10. Details of the speed determining process will be specifically described with reference to FIG. 5B. FIG. 5B illustrates the speed determining process performed in the speed determining part 21c.

In FIG. 5B, patterns of combination of the information received by the speed determining part 21c from the hold control part 21b as to whether the wafer W is present in the hand 10 are defined as "pattern types", each of the "pattern types" being identified by a unique number defined as "pattern #".

Based on the patterns of combination of the information received from the hold control part 21b as to whether the wafer W is present in the hand 10, the speed determining part 21c first extracts from the speed information 22a a corresponding specified speed for each of the first hand 10a and the second hand 10b.

For example, as illustrated in FIG. 5B, if the pattern of combination of the information as to whether the wafer W is present is "pattern #1", the speed determining part 21c extracts from the speed information 22a "high speed" that represents the specified speed corresponding to the first hand 10a and "high speed" that represents the specified speed corresponding to the second hand 10b.

The speed determining part 21c then determines a minimum value of a set of extracted specified speed data as a representative speed. For the abovementioned "pattern #1", therefore, the speed determining part 21c determines "high speed" as the representative speed.

As also illustrated in FIG. 5B, with "pattern #2" in which the wafer W is present only in the first hand 10a dedicated to use for the normal temperature, the speed determining part 21c extracts "medium speed" for the specified speed of the first hand 10a and "high speed" for the specified speed of the second hand 10b. The speed determining part 21c then determines the "medium speed" that is the minimum value as the representative speed.

Similarly, with "pattern #3" in which the wafer W is present only in the second hand 10b dedicated to use for the abnormal temperature, the speed determining part 21c extracts "high speed" for the specified speed of the first hand 10a and "low speed" for the specified speed of the second hand 10b. The speed determining part 21c then determines the "low speed" that is the minimum value as the representative speed.

Similarly, with "pattern #4" in which the wafer W is present both in the first hand 10a and the second hand 10b, the speed determining part 21c extracts "medium speed" for the specified speed of the first hand 10a and "low speed" for the specified speed of the second hand 10b. The speed determining part 21c then determines the "low speed" that is the minimum value as the representative speed.

Such representative speeds are determined as described above and applied accordingly in each of an operation for transferring the wafer W from processing equipment (hereinafter referred to as a "GET operation") and an operation for transferring the wafer W onto the processing equipment (hereinafter referred to as a "PUT operation").

Specific examples in this respect are illustrated in FIGS. 6A to 6D. FIGS. 6A to 6D are schematic views illustrating the exemplary applications of the representative speeds. It is noted that, in each of FIGS. 6A to 6D, a trajectory of the hand 10 drawn among teach points a to e is schematically illustrated from the horizontal direction.

Figure 6A:
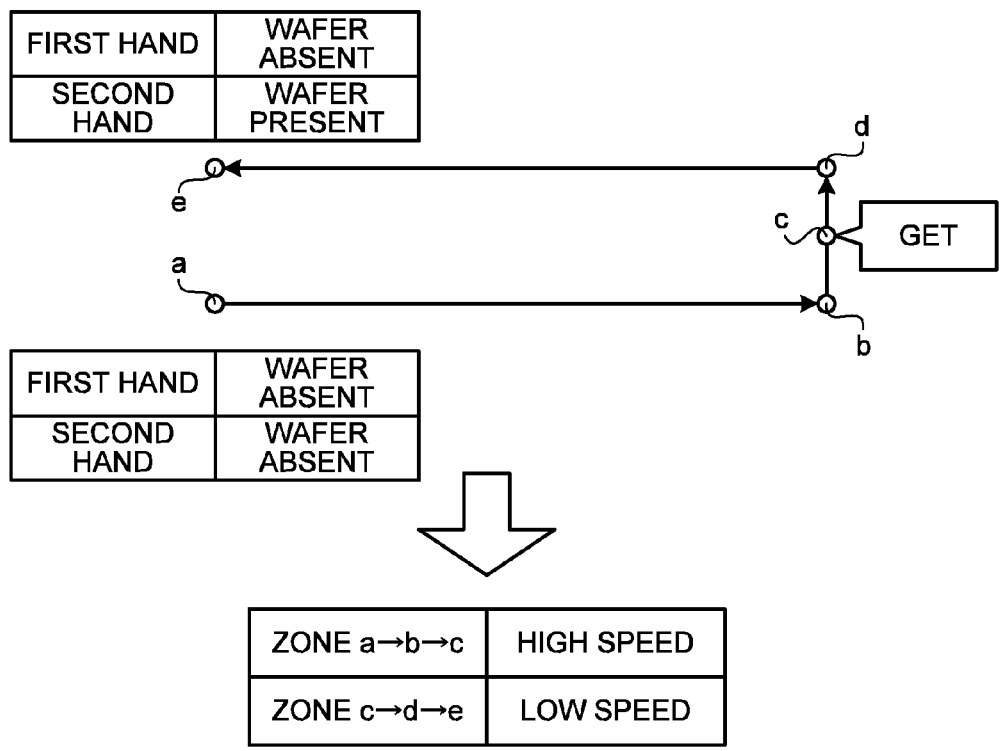
FIGS. 6A to 6D are schematic views illustrating exemplary applications of representative speeds.
Figure 6B:
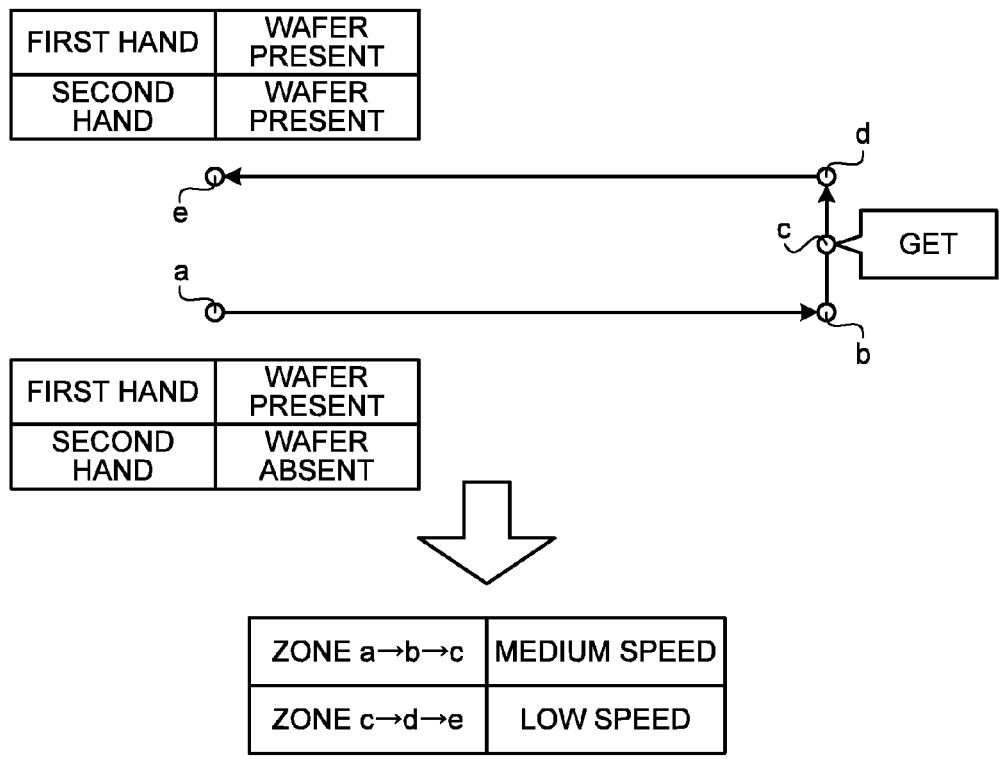

Referring first to FIGS. 6A and 6B, the exemplary applications of the representative speeds during the GET operation will be described. As illustrated in FIGS. 6A and 6B, assume a series of GET operation in which a path is followed from the teach point a to reach the teach point e via the teach points b, c, and d. It is also assumed that the wafer W is obtained ("GET") at the teach point c.

As illustrated in FIG. 6A, if the wafer W is absent both in the first hand 10a and the second hand 10b at the teach point a (specifically, for pattern #1 of FIG. 5B), the hand 10 is controlled so as to travel at "high speed" for a zone from the teach point a to the teach point c.

As illustrated in FIG. 6A, if the wafer W is obtained ("GET") by the second hand 10b at the teach point c under the condition (specifically, for pattern #3 in FIG. 5B), the hand 10 is controlled so as to travel at "low speed" for a zone from the teach point c to the teach point e.

Similarly, referring to FIG. 6B, if the wafer W is present only in the first hand 10a at the teach point a (specifically, for pattern #2 of FIG. 5B), the hand 10 is controlled so as to travel at "medium speed" for the zone from the teach point a to the teach point c.

As illustrated in FIG. 6B, if the wafer W is obtained ("GET") by the second hand 10b at the teach point c under the condition (specifically, for pattern #4 in FIG. 5B), the hand 10 is controlled so as to travel at "low speed" for the zone from the teach point c to the teach point e.

Figure 6C:
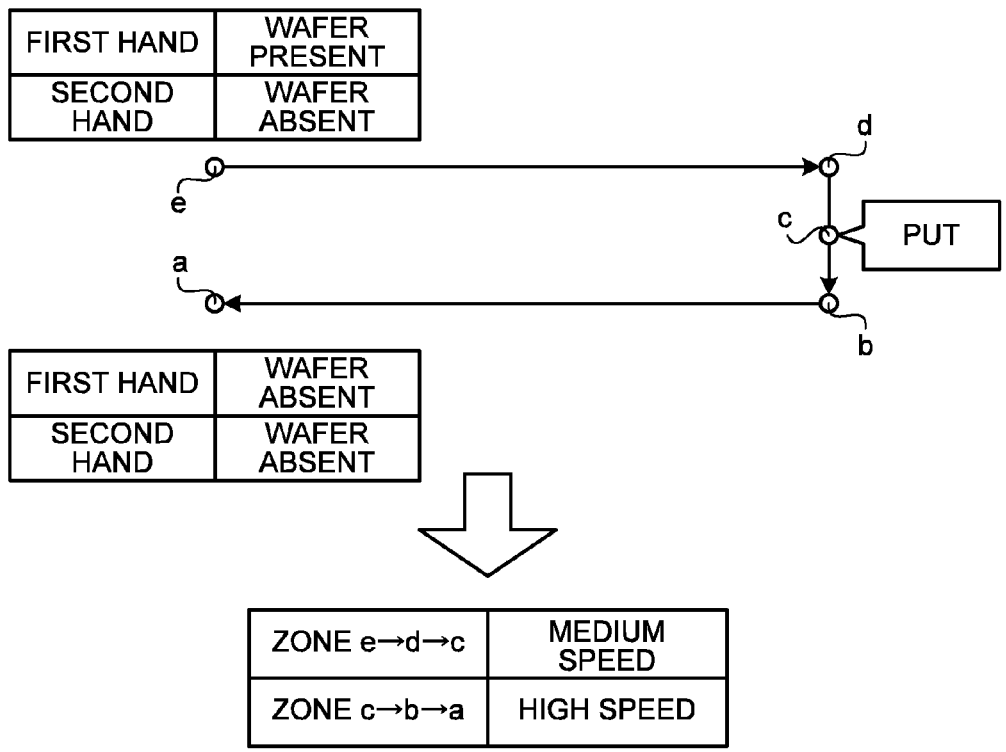
Figure 6D:
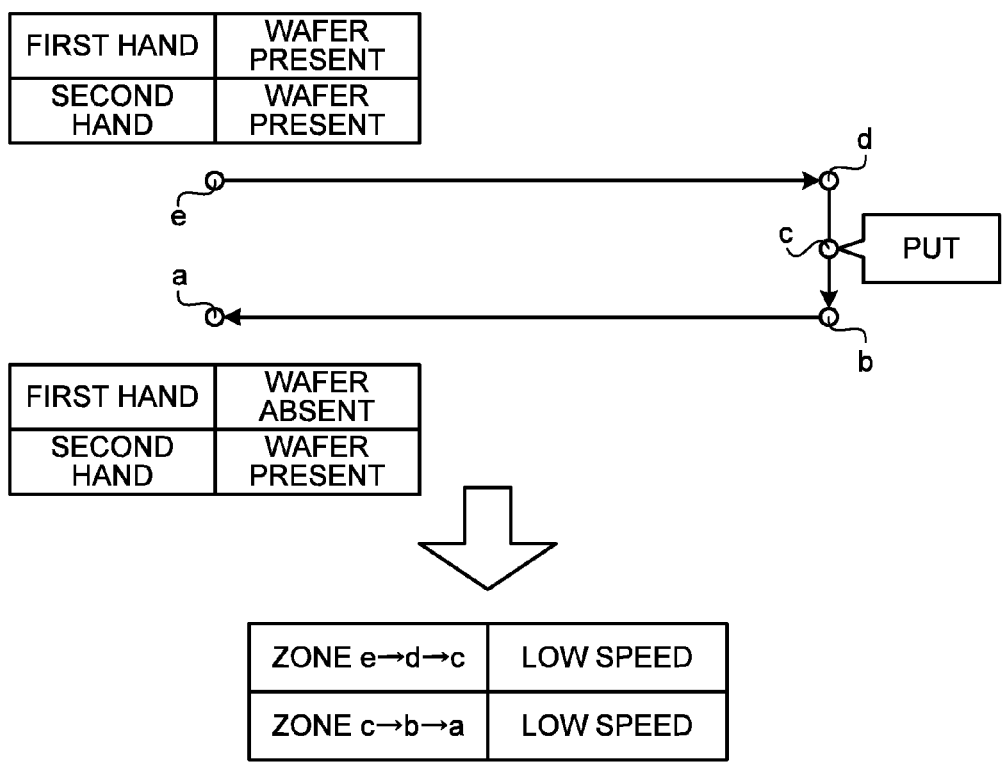

Referring next to FIGS. 6C and 6D, the exemplary applications of the representative speeds during the PUT operation will be described. As illustrated in FIGS. 6C and 6D, assume a series of PUT operation in which a path is followed from the teach point e to reach the teach point a via the teach points d, c, and b. It is also assumed that the wafer W is put ("PUT") at the teach point c.

As illustrated in FIG. 6C, if the wafer W is present only in the first hand 10a at the teach point e (specifically, for pattern #2 of FIG. 5B), the hand 10 is controlled so as to travel at "medium speed" for a zone from the teach point e to the teach point c.

As illustrated in FIG. 6C, if the wafer W is put ("PUT") by the first hand 10a at the teach point c under the condition (specifically, for pattern #1 in FIG. 5B), the hand 10 is controlled so as to travel at "high speed" for a zone from the teach point c to the teach point a.

Similarly, as illustrated in FIG. 6D, if the wafer W is present both in the first hand 10a and the second hand 10b at the teach point e (specifically, for pattern #4 of FIG. 5B), the hand 10 is controlled so as to travel at "low speed" for the zone from the teach point e to the teach point c.

As illustrated in FIG. 6D, if the wafer W is put ("PUT") by the first hand 10a at the teach point c under the condition (specifically, for pattern #3 in FIG. 5B), the hand 10 is controlled so as to travel still at "low speed" for the zone from the teach point c to the teach point a.

Figure 7:
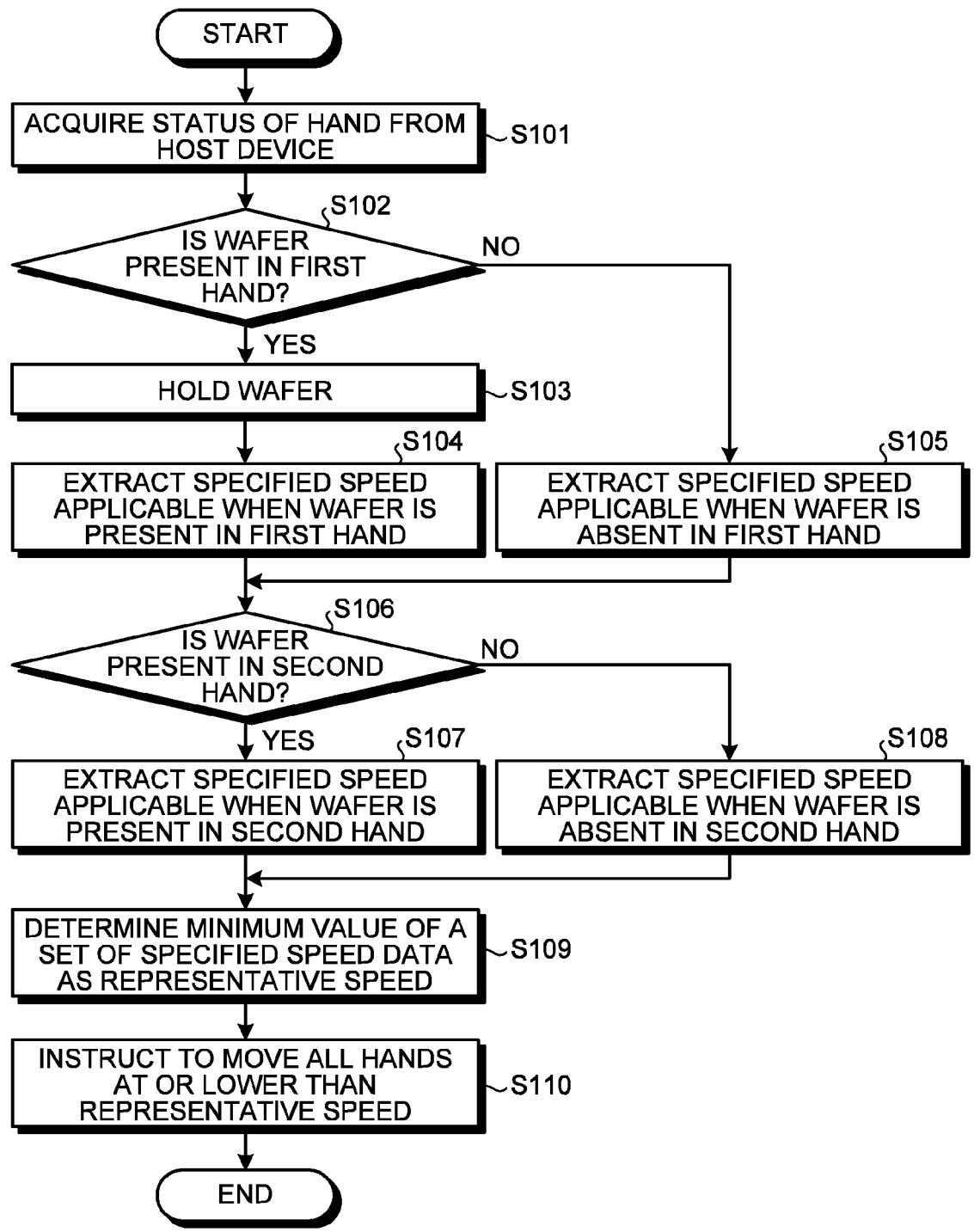
FIG. 7 is a flowchart illustrating processing performed by the transfer system according to the first embodiment.

Processing performed by the transfer system 100 according to the first embodiment will be described below with reference to FIG. 7. FIG. 7 is a flowchart illustrating the processing performed by the transfer system 100 according to the first embodiment.

As illustrated in FIG. 7, the status acquiring part 21a acquires from the host device 30 the status of the hand 10 including the information on the presence of the wafer W (step S101). Then, based on the status of the hand 10 thus acquired, it is determined whether the wafer W is present in the first hand 10a dedicated to use for the normal temperature (step S102).

If it is determined that the wafer W is present in the first hand 10a (Yes at step S102), the hold control part 21b operates the holding mechanism of the first hand 10a thereby to hold the wafer W (step S103). The speed determining part 21c then extracts from the speed information 22a the specified speed applicable when the wafer W is present in the first hand 10a (step S104).

If it is determined that the wafer W is absent in the first hand 10a (No at step S102), the speed determining part 21c then extracts from the speed information 22a the specified speed applicable when the wafer W is absent in the first hand 10a (step S105).

Next, based on the status of the hand 10 acquired at step S101, it is determined whether the wafer W is present in the second hand 10b dedicated to use for the abnormal temperature (step S106).

If it is determined that the wafer W is present in the second hand 10b (Yes at step S106), the speed determining part 21c then extracts from the speed information 22a the specified speed applicable when the wafer W is present in the second hand 10b (step S107).

If it is determined that the wafer W is absent in the second hand 10b (No at step S106), the speed determining part 21c then extracts from the speed information 22a the specified speed applicable when the wafer W is absent in the second hand 10b (step S108).

The speed determining part 21c then determines the minimum value of a set of extracted specified speed data as the representative speed (step S109). The speed determining part 21c then requests the instructing part 21d to move the hand 10 at or lower than the representative speed thus determined. The instructing part 21d instructs the robot 1 to operate according to the request thus received (step S110) and the processing is terminated.

As described heretofore, the transfer system according to the first embodiment includes the multiple hands, the storage unit, and the instructing part. The hands hold the wafer. The storage unit stores therein the speed information that represents the temperature of the wafer associated with the specified speed of the hand for holding the wafer. The instructing part extracts the specified speed for each hand from the speed information and instructs to move all of the robot hands at or lower than the representative speed determined based on the set of extracted specified speed data.

In the transfer system according to the first embodiment, therefore, the substrates can be efficiently transferred without allowing any positional deviation to occur.

The first embodiment has been described for a case in which the first hand 10a is dedicated to use for the "normal temperature" and the second hand 10b is dedicated to use for the "abnormal temperature" (specifically, the application is static) and the status of the hand including whether a wafer is present therein is acquired from the host device. Alternatively, the application of the hands may be dynamic, so that the first hand and the second hand are applied dynamically according to the status of the hand acquired by the controller. In a second embodiment to be described below, such a dynamic application of the hands will be described with reference to FIGS. 8 to 10.

Second Embodiment

Figure 8:
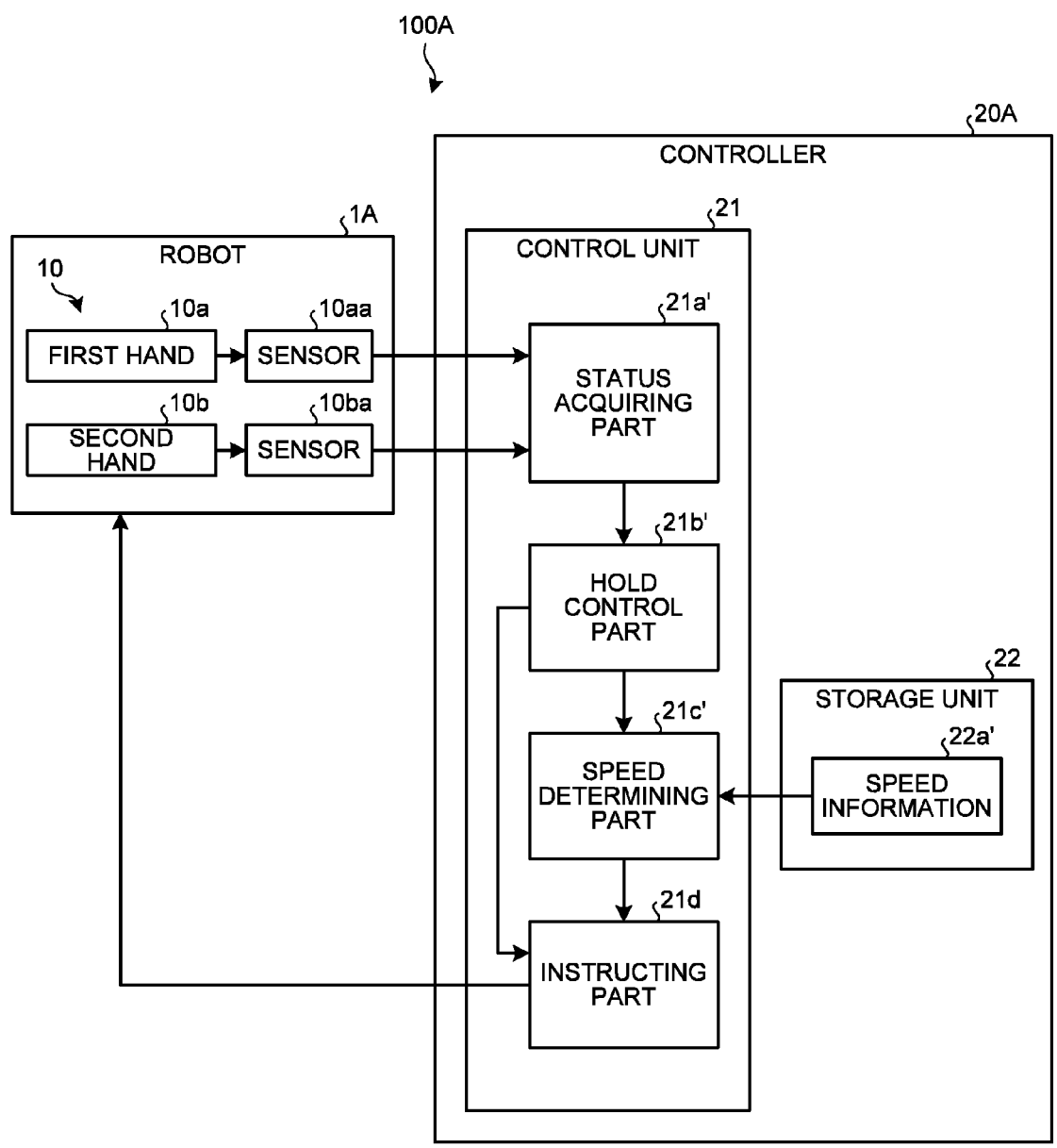
FIG. 8 is a block diagram illustrating an exemplary configuration of a transfer system according to a second embodiment.

FIG. 8 is a block diagram illustrating an exemplary configuration of a transfer system 100A according to the second embodiment. Between FIG. 8 and FIG. 4 illustrating the transfer system 100 according to the first embodiment, like reference numerals denote like or corresponding elements. Descriptions for those like or corresponding elements will be omitted or simplified.

As illustrated in FIG. 8, the transfer system 100A includes a robot 1A and a controller 20A. The robot 1A includes the first hand 10a and a sensor 10aa associated therewith. Similarly, the robot 1A includes the second hand 10b and a sensor 10ba associated therewith.

Unlike the first embodiment, the application of the first hand 10a and the second hand 10b is not dedicated to use for "normal temperature" or "abnormal temperature".

The sensor 10aa and the sensor 10ba are detecting devices configured to detect whether a wafer W is present and the temperature of the wafer W. It is noted that, though the devices for detecting whether a wafer W is present and the temperature of the wafer W can be configured separately in actual applications, the second embodiment includes the sensor 10aa and the sensor 10ba as a single element collectively.

A status acquiring part 21a' is then to acquire the status of the hand 10, including the presence of the wafer W and the temperature of the wafer W in each of the first hand 10a and the second hand 10b.

A hold control part 21b' requests the instructing part 21d to operate (specifically, enable) the holding mechanism based on information on the presence and temperature of the wafer W in the hand 10 received from the status acquiring part 21a'.

If, for example, a wafer W is present in the first hand 10a and the temperature of the wafer W is normal temperature, the hold control part 21b' operates the holding mechanism of the first hand 10a. Similarly, if a wafer W is present in the second hand 10b and the temperature of the wafer W is normal temperature, the hold control part 21b' operates the holding mechanism of the second hand 10b.

It is noted that, if the status of the hand 10 does not meet the above conditions, the hold control part 21b' requests the instructing part 21d not to operate (specifically, to disable) the holding mechanism.

A speed determining part 21c' is then to determine the representative speed for the hand 10 based on the information on the presence and temperature of the wafer W in the hand 10 received from the hold control part 21b' and speed information 22a' of the storage unit 22.

Exemplary speed information 22a' according to the second embodiment will be described below with reference to FIG. 9. FIG. 9 is an exemplary table illustrating the speed information 22a' according to the second embodiment. It is noted that FIG. 9 corresponds to FIG. 5A and descriptions common to both will be omitted.

As illustrated in FIG. 9, the speed information 22a' defines "presence of wafer" and "specified speed" for all "temperature types" for each of the "hand type".

Specifically, the speed information 22a' defines information for holding the wafer W at "normal temperature" or "abnormal temperature" for each of the first hand 10a and the second hand 10b. This enables dynamic response even when the application of each of the first hand 10a and the second hand 10b is not defined.

Figure 10:
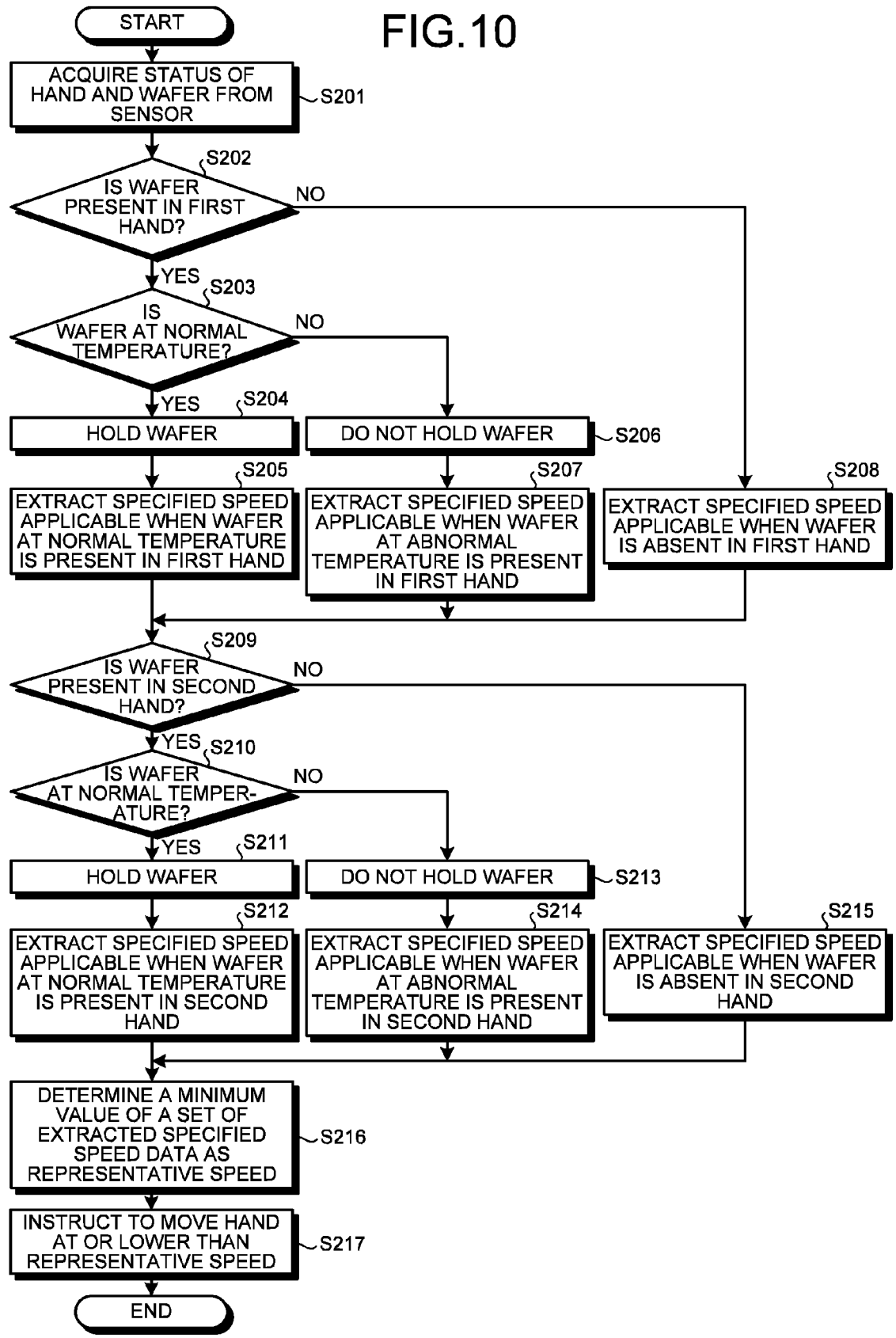
FIG. 10 is a flowchart illustrating processing performed by the transfer system according to the second embodiment.

Processing performed by the transfer system 100A according to the second embodiment will be described below with reference to FIG. 10. FIG. 10 is a flowchart illustrating the processing performed by the transfer system 100A according to the second embodiment.

As illustrated in FIG. 10, the status acquiring part 21a' first acquires from the sensor 10aa and the sensor 10ba the status of the hand 10 including the presence and temperature of the wafer W (step S201). Based on the status of the hand 10 thus acquired, it is then determined whether the wafer W is present in the first hand 10a (step S202).

If it is determined that the wafer W is present in the first hand 10a (Yes at step S202), it is next determined whether the wafer W is at normal temperature (step S203).

If it is determined that the wafer W is at normal temperature (Yes at step S203), the hold control part 21b' operates the holding mechanism of the first hand 10a thereby to hold the wafer W (step S204). The speed determining part 21c' then extracts from the speed information 22a' the specified speed applicable when a wafer W at normal temperature is present in the first hand 10a (step S205).

If it is determined that the wafer W is at abnormal temperature (No at step S203), the hold control part 21b' does not allow the holding mechanism of the first hand 10a to hold the wafer W (step S206). The speed determining part 21c' then extracts from the speed information 22a' the specified speed applicable when a wafer W at abnormal temperature is present in the first hand 10a (step S207).

If it is determined that the wafer W is absent in the first hand 10a (No at step S202), the speed determining part 21c' then extracts from the speed information 22a' the specified speed applicable when a wafer W is absent in the first hand 10a (step S208).

Next, based on the status of the hand 10 acquired at step S201, it is determined whether a wafer W is present in the second hand 10b (step S209).

If it is determined that a wafer W is present in the second hand 10b (Yes at step S209), it is next determined whether the wafer W is at normal temperature (step S210).

If it is determined that the wafer W is at normal temperature (Yes at step S210), the hold control part 21b' operates the holding mechanism of the second hand 10b thereby to hold the wafer W (step S211). The speed determining part 21c' then extracts from the speed information 22a' the specified speed applicable when a wafer W at normal temperature is present in the second hand 10b (step S212).

If it is determined that the wafer W is at abnormal temperature (No at step S210), the hold control part 21b' does not allow the holding mechanism of the second hand 10b to hold the wafer W (step S213). The speed determining part 21c' then extracts from the speed information 22a' the specified speed applicable when a wafer W at abnormal temperature is present in the second hand 10b (step S214).

If it is determined that the wafer W is absent in the second hand 10b (No at step S210), the speed determining part 21c' then extracts from the speed information 22a' the specified speed applicable when a wafer W is absent in the second hand 10b (step S215).

The speed determining part 21c then determines the minimum value of a set of extracted specified speed data as the representative speed (step S216). The speed determining part 21c then requests the instructing part 21d to move the hand 10 at or lower than the representative speed thus determined. The instructing part 21d instructs the robot 1A to operate according to the request thus received (step S217) and the processing is terminated.

As described heretofore, the transfer system according to the second embodiment includes the multiple hands, the sensor, the storage unit, and the instructing part. The hands hold the wafer. The sensor detects the status of each of the hands, including the presence and temperature of the wafer. The storage unit stores therein the speed information that represents the temperature of the wafer associated with the specified speed of the hand for holding the wafer. The instructing part extracts the specified speed for each hand from the speed information and instructs to move all of the robot hands at or lower than the representative speed determined based on the set of extracted specified speed data.

In the transfer system according to the second embodiment, therefore, the workpiece can be efficiently transferred without having to limit the type of hand to be used according to the temperature of the wafer and without allowing any positional deviation to occur.

Each of the first and second embodiments has been described exemplarily for a case in which the speed with which the hand is moved is controlled. Acceleration may, however, be controlled instead of the speed.

Additionally, each of the first and second embodiments has been described exemplarily for a case in which the minimum value of a set of extracted specified speed data is used as the representative speed. This is, however, not the only possible arrangement; alternatively, for example, instead of defining the minimum value directly as the representative speed, the minimum value may be subject to further processing, such as, for example, adding a permissible correction value to the minimum value.

Additionally, each of the first and second embodiments has been described exemplarily for a case in which a single arm has two hands disposed at its distal end portion. It is to be understood that this is not to limit the number of hands; alternatively, the arm may have three or more hands.

Additionally, each of the first and second embodiments has been described for an exemplary single-arm robot. The present embodiments may still be applied to a multi-arm robot. If the embodiments are applied to a multi-arm robot, one hand may be disposed at the distal end portion of each single arm.

Additionally, each of the first and second embodiments has been described exemplarily for a case in which the workpiece to be transferred is a substrate and the substrate is mainly a wafer. It is, however, to be understood that the present embodiments can be applied to any type of substrate. For example, the substrate may be a glass substrate for a liquid crystal panel display. In addition, the workpiece may not necessarily be a substrate, as long as the workpiece is a thin sheet.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A transfer system comprising:
   a robot having an arm, the arm having a distal end;
   a first robot hand disposed at the distal end of the arm, the first hand having a first plate;
   a second hand disposed at the distal end of the arm, the second hand having a second plate, the first plate and the second plate each being configured to receive a thin sheet-like workpiece, the first hand and the second hand are rotatably and coaxially disposed on the distal end of the arm, at least one of the first hand and the second hand having a holding mechanism configured to hold a peripheral edge of the workpiece;
   a storage unit configured to store speed information that defines specified speeds for movement of the first hand and the second hand, the specified speeds being defined based on:
      presence or absence of a workpiece in the first hand and the second hand, respectively;
      whether or not the holding mechanism is holding the workpiece present in the first hand and the second hand, respectively; and
      a temperature of the workpiece present in the first hand and the second hand, respectively; and
   an instructing part configured to extract the specified speeds for movement of the first hand and the second hand from the speed information using current conditions of the first hand, the second hand, and workpieces thereon, the instructing part is further configured to instruct to move both the first hand and the second hand at or lower than a representative speed determined based on the extracted specified speeds,
   wherein the instructing part is configured to instruct the holding mechanism to hold the peripheral edge of the workpiece when the workpiece is at normal temperature, and wherein the instructing part is configured to instruct the holding mechanism not to hold the peripheral edge of the workpiece when the workpiece is at an abnormal temperature, and
   wherein the specified speeds are defined as lower speed amounts when the holding mechanism is not holding the workpiece than when the holding mechanism is holding the workpiece.

2. The transfer system according to claim 1, wherein the instructing part determines a minimum value of the extracted specified speeds as the representative speed.

3. The transfer system according to claim 1, wherein
   the speed information includes the specified speed of a robot hand that does not hold the workpiece; and
   the specified speed of the robot hand that does not hold the workpiece is greater than the specified speed of a robot hand that holds the workpiece at normal temperature, and is also greater than the specified speed of a robot hand that holds the workpiece at abnormal temperature.

4. The transfer system according to claim 2, wherein
   the speed information includes the specified speed of a robot hand that does not hold the workpiece; and
   the specified speed of the robot hand that does not hold the workpiece is greater than the specified speed of a robot hand that holds the workpiece at normal temperature, and is also greater than the specified speed of a robot hand that holds the workpiece at abnormal temperature.

5. The transfer system according to claim 1, wherein:
   the first hand that includes the holding mechanism for holding the peripheral edge of the workpiece, the first hand is configured to use the holding mechanism to hold the workpiece at normal temperature; and
   the second hand does not include the holding mechanism, the second hand is configured to receive the workpiece at abnormal temperature.

6. The transfer system according to claim 2, wherein:
   the first hand includes the holding mechanism for holding the peripheral edge of the workpiece the first hand is configured to use the holding mechanism to hold the workpiece at normal temperature; and
   the second hand does not include the holding mechanism, the second hand is configured to receive the workpiece at abnormal temperature.

7. The transfer system according to claim 3, wherein:
   the first hand includes the holding mechanism for holding the peripheral edge of the workpiece, the first hand is configured to use the holding mechanism to hold the workpiece at normal temperature; and
   the second hand does not include the holding mechanism, the second hand is configured to receive the workpiece at abnormal temperature.

8. The transfer system according to claim 4, wherein:
   the first hand includes the holding mechanism for holding the peripheral edge of the workpiece, the first hand is configured to use the holding mechanism to hold the workpiece at normal temperature; and
   the second hand does not include the holding mechanism, the second hand is configured to receive the workpiece at abnormal temperature.

9. The transfer system according to claim 1, wherein
   the first and second hands each include the holding mechanism for holding the peripheral edge of the workpiece; and
   the instructing part enables operation of the holding mechanism when the workpiece to be held is at normal temperature and disables the operation of the holding mechanism when the workpiece to be held is at abnormal temperature.

10. The transfer system according to claim 2, wherein
    the first and second hands include the holding mechanism for holding the peripheral edge of the workpiece; and the instructing part enables operation of the holding mechanism when the workpiece to be held is at normal temperature and disables the operation of the holding mechanism when the workpiece to be held is at abnormal temperature.

11. The transfer system according to claim 3, wherein the first and second hands each include the holding mechanism for holding the peripheral edge of the workpiece; and the instructing part enables operation of the holding mechanism when the workpiece to be held is at normal temperature and disables the operation of the holding mechanism when the workpiece to be held is at abnormal temperature.

12. The transfer system according to claim 4, wherein the first and second hands each include the holding mechanism for holding the peripheral edge of the workpiece; and the instructing part enables operation of the holding mechanism when the workpiece to be held is at normal temperature and disables the operation of the holding mechanism when the workpiece to be held is at abnormal temperature.

13. A transfer system comprising:

a robot having an arm, the arm having a distal end;

a first robot hand disposed at the distal end of the arm, the first hand having a first plate;

a second hand disposed at the distal end of the arm, the second hand having a second plate, the first plate and the second plate each being configured to receive a thin sheet-like workpiece, the first hand and the second hand are rotatably and coaxially disposed on the distal end of the arm, at least one of the first hand and the second hand having a holding mechanism configured to hold a peripheral edge of the workpiece;

a storage means for storing speed information that defines specified speeds for movement of the first hand and the second hand, the specified speeds being defined based on:

presence or absence of a workpiece in the first hand and the second hand, respectively;

whether or not the holding mechanism is holding the workpiece present in the first hand and the second hand, respectively; and a temperature of the workpiece present in the first hand and the second hand, respectively; and an instructing means for extracting the specified speeds for movement of the first hand and the second hand from the speed information using current conditions of the first hand, the second hand, and workpieces thereon, the instructing means further instructs to move both the first hand and the second hand at or lower than a representative speed determined based on the extracted specified speeds, wherein the instructing means instructs the holding mechanism to hold the peripheral edge of the workpiece when the workpiece is at normal temperature, and wherein the instructing means instructs the holding mechanism not to hold the peripheral edge of the workpiece when the workpiece is at an abnormal temperature, and wherein the specified speeds are defined as lower speed amounts when the holding mechanism is not holding the workpiece than when the holding mechanism is holding the workpiece.

14. The transfer system according to claim 1, wherein the instructing part determines a minimum value of the extracted specified speeds as the representative speed, and wherein the instructing part is configured to instruct to move both the first hand and the second hand at the representative speed.

15. The transfer system according to claim 13, wherein the instructing means determines a minimum value of the extracted specified speeds as the representative speed, and wherein the instructing means instructs to move both the first hand and the second hand at the representative speed.

* * * * *